(12) United States Patent
He et al.

(10) Patent No.: US 9,853,088 B2
(45) Date of Patent: Dec. 26, 2017

(54) ALL-PRINTED PAPER MEMORY

(71) Applicant: King Abdullah University of Science and Technology, Thuwal (SA)

(72) Inventors: Jr-Hau He, Thuwal (SA); Chun-Ho Lin, Thuwal (SA); Der-Hsien Lien, Taipei (TW)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 39 days.

(21) Appl. No.: 14/986,380

(22) Filed: Dec. 31, 2015

(65) Prior Publication Data

US 2016/0190445 A1 Jun. 30, 2016

Related U.S. Application Data

(60) Provisional application No. 62/098,629, filed on Dec. 31, 2014.

(51) Int. Cl.
*H01L 29/02* (2006.01)
*H01L 47/00* (2006.01)
(Continued)

(52) U.S. Cl.
CPC ...... *H01L 27/2409* (2013.01); *H01L 27/2463* (2013.01); *H01L 45/085* (2013.01);
(Continued)

(58) Field of Classification Search
CPC .. H01L 27/2409; H01L 27/2463; H01L 45/14
(Continued)

(56) References Cited

U.S. PATENT DOCUMENTS

| 7,824,956 B2 | 11/2010 | Schricker et al. | |
| 2006/0098485 A1* | 5/2006 | Leenders | B82Y 10/00 365/185.12 |

(Continued)

FOREIGN PATENT DOCUMENTS

| CN | 103247758 A | 8/2013 |
| WO | 2006135246 A1 | 12/2006 |

OTHER PUBLICATIONS

Der-Hsien Lien, Zhen-Kai Kao, Teng-Han Huang, Ying-Chih Liao, Si-Chen Lee, Jr-Hau He "All-Printed Paper Memory" Jul. 14, 2014 www.acsnano.org vol. 8, No. 8, pp. 7613-7619.*

Der-Hsien Lien, Zhen-Kai Kao, Teng-Han Huang, Ying-Chih Liao, Si-Chen Lee, Jr-Hau He "All Printed Paper Memory" Jul. 14, 2014 www.acsnano.org vol. 8 No. 8 pp. 7613-7619.*

(Continued)

*Primary Examiner* — David Vu
*Assistant Examiner* — Brandon Fox
(74) *Attorney, Agent, or Firm* — Patent Portfolio Builders PLLC

(57) ABSTRACT

All-printed paper-based substrate memory devices are described. In an embodiment, a paper-based memory device is prepared by coating one or more areas of a paper substrate with a conductor material such as a carbon paste, to form a first electrode of a memory, depositing a layer of insulator material, such as titanium dioxide, over one or more areas of the conductor material, and depositing a layer of metal over one or more areas of the insulator material to form a second electrode of the memory. In an embodiment, the device can further include diodes printed between the insulator material and the second electrode, and the first electrode and the second electrodes can be formed as a crossbar structure to provide a WORM memory. The various layers and the diodes can be printed onto the paper substrate by, for example, an ink jet printer.

29 Claims, 12 Drawing Sheets

(51) Int. Cl.
  *H01L 27/24* (2006.01)
  *H01L 45/00* (2006.01)
(52) U.S. Cl.
  CPC .......... *H01L 45/1233* (2013.01); *H01L 45/14* (2013.01); *H01L 45/146* (2013.01); *H01L 45/1608* (2013.01)
(58) Field of Classification Search
  USPC ....................................................... 257/2, 4
  See application file for complete search history.

(56) References Cited

U.S. PATENT DOCUMENTS

| | | | |
|---|---|---|---|
| 2007/0015348 A1 | 1/2007 | Hsu et al. | |
| 2009/0323397 A1* | 12/2009 | Kinoshita | G11C 13/0007 365/148 |
| 2010/0209594 A1* | 8/2010 | Curtis | B41M 5/0023 427/74 |
| 2014/0061049 A1* | 3/2014 | Lo | B01L 3/502761 204/547 |
| 2015/0249096 A1* | 9/2015 | Lupino | H01L 27/11898 257/203 |
| 2015/0295193 A1* | 10/2015 | Park | H01L 51/0097 257/40 |

OTHER PUBLICATIONS

Lien D-H et al: "All-Printed Paper Memory", ACS NANO, vol. 8, No. 8, Jul. 14, 2014 (Jul. 14, 2014), pp. 7613-7619, XP055267849, ISSN: 1936-0851, DOI: 10.1021/nn501231z p. 7614, right-hand column, paragraph 2—p. 7615, right-hand column; figures 1, 2 section "Fabrication Process"; p. 7618.

Lien D-H et al: "Paper Memory by All Printing Technology", 2014 Symposium on VLSI Technology, Jun. 9-12, 2014, Honolulu, HI, USA, Jun. 9, 2014 (Jun. 9, 2014), XP032640147, ISBN: 978-1-4799-3332-7 sections II, II.a; figures 1. 2.

Muhammad N M et al: "Fabrication of printed memory device having zinc-oxide active nano-layer and investigation of resistive switching", Current Applied Physics, vol. 13, No. 1, Jun. 28, 2012 (Jun. 28, 2012), pp. 90-96, XP055267884, ISSN: 1567-1739, DOI: 10.1016j. cap.2012.06.017 sections 2, 3.1; figures 2. 3.

Gambuzza L V et al: "A data driven model of Ti02 printed memristors", 8th International Conference on Electrical and Electronics Engineering, Nov. 28-30, 2013, Bursa, Turkey, Nov. 28, 2013 (Nov. 28, 2013), pp. 1-4, XP032551734, [retrieved on Jan. 15, 2014] section 2; figure 1.

International Search Report and Written Opinion for PCT/IB2015/002474 dated May 4, 2016.

International Search Report and Written Opinion Application No. PCT/IB2015/002644 dated Sep. 6, 2016, 15 pages.

* cited by examiner

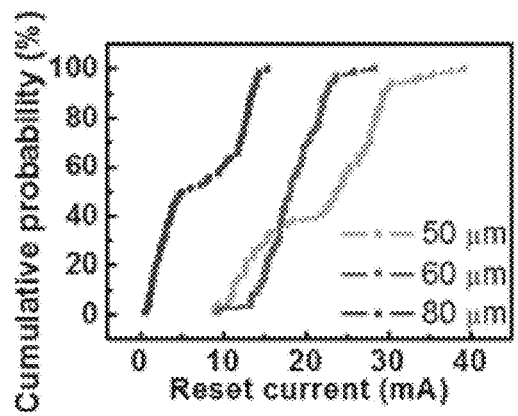 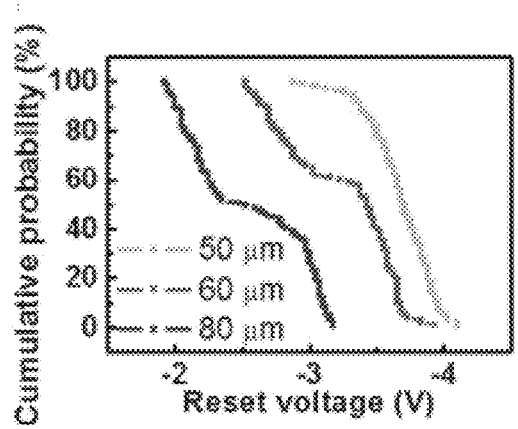
FIG. 11A   FIG. 11B
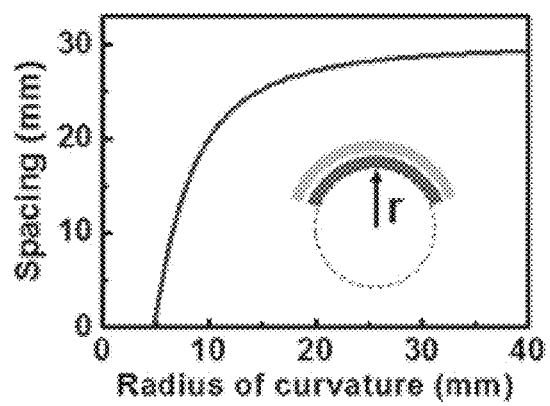
FIG. 12

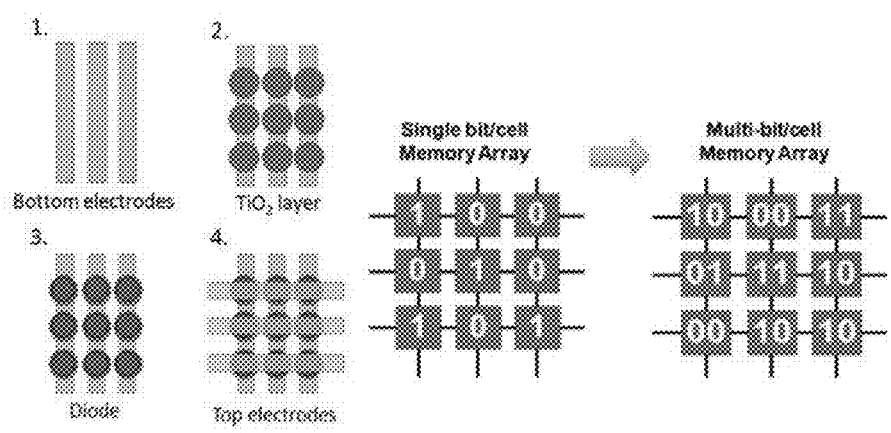
*FIG. 14A*  *FIG. 14B*

ALL-PRINTED PAPER MEMORY

CROSS-REFERENCE TO RELATED APPLICATION

This application claims the benefit of and priority to U.S. Provisional Patent Application No. 62/098,629 entitled "All-Printed paper Memory" filed on Dec. 31, 2014, which is expressly incorporated by reference as if fully set forth herein in their entirety.

BACKGROUND

Due to developments in modern microelectronics, a variety of electronic devices, such as optical discs, hard disk drives, and semiconductor or flash memory devices, are being replaced with new types of memory devices. Recently, with new cheaper, simpler, and more energy-efficient microelectronic fabrication processes, attention has been focused on making electronic devices using printing techniques on various types of substrates, especially flexible substrates.

SUMMARY

According to the embodiments described herein, paper can be relied upon as a means to store data. Recently, with new cheaper, simpler, and more energy-efficient microelectronic fabrication processes, attention has been focused on making electronic devices using printing techniques on various types of substrates, especially flexible substrates. Demand for paper-based substrate electronics may be high because of its flexibility, foldability, low cost, mass producibility, disposability, retrievability, and ease of processing, among other factors. Various types of electronic components have been implemented on paper substrates, including wires, resistors, capacitors, transistors, diodes, etc. However, the ability to fully implement and activate paper-based substrate memory devices, a key component in various circuits, is still needed.

Certain challenges in manufacturing paper-based substrate memory devices stem from the difficulties of device fabrication on paper substrates. Typically, memory devices require thin and uniform layers, but paper substrates are rough, porous, and fibrous. Moreover, although volatile memories may be more easily fabricated on paper substrates, embedded power solutions for such volatile memories may be unrealistic in paper-based electronic systems. In this context, the ability to manufacture suitable non-volatile paper-based substrate memory devices would be desirable.

Resistive random access memory (RRAM, or sometimes ReRAM), an emerging type of non-volatile memory, presents potential as a suitable solution for paper-based memory device applications. RRAM includes one or more memory cells in a memory device, e.g., a semiconductor memory chip. A memory cell includes a bottom electrode, a switching medium and a top electrode according an embodiment of the present disclosure. The switching medium, that can be comprised of an insulator material, can exhibit a resistance that can be selectively set to various values, and reset, using appropriate control circuitry. The memory cell can be a two-terminal resistive memory device, e.g., resistive random-access memory (RRAM), in the present embodiment.

The resistive memory cell can be a two-terminal memory cell having the switching medium provided between top and bottom electrodes. The resistance of the switching medium can be controlled by applying an electrical signal to the electrodes. The electrical signal may be current-based or voltage-based. As used herein, the term "RRAM" or "resistive memory cell" refers to a memory cell or memory device that uses a switching medium whose resistance can be controlled by applying electrical signal without ferroelectricity, magnetization and phase change of the switching medium. The changes in resistance may be identified by an associated measurement circuit and coded into binary (or other multi-level) states (e.g., 0, 1, 00, 01, 10, 11, . . . etc.). Structural simplicity is an advantage of RRAM, as only one insulator and two electrodes are required.

The realization of paper-based substrate memory devices relies upon fabrication techniques that are compatible with paper substrates. Conventional techniques, such as chemical vapor deposition and sputtering, usually require vacuum and/or high temperature conditions. Most of these fabrication processes are not suitable for paper-based substrate memory device fabrication. Alternatively, printing technologies, such as screen printing, inkjet printing, micro-contact printing, and 3D printing, are more efficient and flexible fabrication processes. Further, these printing technologies are appropriate for paper-based substrate electronics and potentially other devices, including batteries, wearable antennas, supercapacitors, nanogenerators, and displays, for example. In addition, paper-based devices can be realized at relatively lower cost as compared to conventional components.

According to the embodiments described herein, paper-based substrate memory devices ("paper-based memory devices," "paper-based memory," or "paper memory") and methods of making the devices are provided. The paper-based memory can be embodied as an all-printed paper memory including a metal-insulator-conductor structure. The metal layer can serve as a top electrode. The insulator layer can serve as the switching medium. And the conductor layer can serve as a bottom electrode. The metal-insulator-conductor structure can be formed from structure of silver (Ag), titanium dioxide ($TiO_2$), and carbon (C) in one or more embodiments.

In an embodiment, a method of forming a paper-based substrate memory device is provided. The method can comprise: coating one or more areas of a paper substrate with a conductor material to form a first electrode of the memory device; depositing, with the least one printer, a layer of an insulator material over one or more areas of the conductor material; and depositing, with the least one printer, a layer of a metal over one or more areas of the insulator material to form a second electrode of the memory device.

In any one or more aspects, the coating of the one or more areas of the paper substrate can comprise coating and curing a plurality of individual layers of the conductor material over the one or more areas of the paper substrate. The number of the plurality of individual layers of the conductor material can comprise, for example, between 8 and 12. A screen printer can be used for coating the conductor material upon the one or more areas of a paper substrate. The depositing of the layer of insulator material can comprise depositing a plurality of layers of the insulator material over the one or more areas of the conductor material. An ink jet printer can be used for depositing the layer of insulator material over the one or more areas of the conductor material. An ink jet printer can be used for depositing the layer of the metal over the one or more areas of the insulator material. The conductor material can be selected from the group consisting of carbon, copper, aluminum, nickel, gold, silver, titanium, germanium, platinum and palladium. The conductor material can be a carbon paste. The insulator material can be a semiconductor material. The insulator material can be selected from the group consisting of titanium dioxide, copper, aluminum, nickel, gold, silver, titanium, germanium, platinum and palladium. The insulator material can comprise a titanium dioxide ink comprising $TiO_2$ nanoparticles, acetyl acetone, Triton-X-100, distilled water, ethanol, and ethylene glycol. The metal can be a metal having mobile metal ions. The metal can be selected from the group consisting of silver, copper, nickel, zinc and gold. The metal can comprise a silver ink comprising Ag nanoparticles, ethylene glycol, and water. The method can further comprise the step of sonicating the silver ink before printing the silver ink with the ink jet printer.

In an embodiment, a paper-based substrate memory device is provided. The paper-based substrate memory can comprise: a paper substrate coated with a conductor material; a layer of insulator material deposited over one or more areas of the conductor material, the layer of insulator material having a thickness of more than 40 µm to less than 100 µm; and a layer of metal deposited over one or more areas of the insulator material. In any one or more aspects, the conductor material can form a first electrode of the memory device; and the metal can form a second electrode of the memory device. The conductor material can be selected from the group consisting of carbon, copper, aluminum, nickel, gold, silver, titanium, germanium, platinum and palladium. The conductor material can be a carbon paste. The insulator material can be a semiconductor material. The insulator material can be selected from the group consisting of titanium dioxide, copper, aluminum, nickel, gold, silver, titanium, germanium, platinum and palladium. The insulator material can comprise a titanium dioxide ink comprising $TiO_2$ nanoparticles, acetyl acetone, Triton-X-100, distilled water, ethanol, and ethylene glycol. The metal can be a metal having mobile metal ions. The metal can be selected from the group consisting of silver, copper, nickel, zinc and gold. The metal can comprise a silver ink comprising Ag nanoparticles, ethylene glycol, and water. The conductor can be carbon paste and the paper substrate can be coated with the carbon paste using a screen printer; the insulator can be titanium dioxide and the layer of titanium dioxide can be deposited using at least one ink jet printer; and the metal can be silver and the layer of silver can be deposited using the at least one ink jet printer.

In an embodiment, a method of forming a paper-based substrate memory device, for example a WORM memory device is provided. The method can comprise coating one or more areas of a paper substrate with a conductor material to form a first electrode of the memory device; depositing, with the least one printer, a layer of an insulator material over one or more areas of the conductor material; depositing, with at least one printer, at least one diode onto the insulator material; and depositing, with the least one printer, a layer of a metal over the at least one diode of the insulator material to form a second electrode of the memory device.

In any one or more aspects, the coating of the one or more areas of the paper substrate can comprise coating and curing a plurality of individual layers of the conductor material over the one or more areas of the paper substrate, such as between 8 and 12 layers. A screen printer can be used for coating the conductor material upon the one or more areas of a paper substrate. Depositing the layer of insulator material can comprise depositing a plurality of layers of the insulator material over the one or more areas of the conductor material. An ink jet printer can be used for depositing the layer of insulator material over the one or more areas of the conductor material, depositing the layer of the metal over the one or more areas of the insulator material, or both. The conductor material can be selected from the group consisting of carbon, copper, aluminum, nickel, gold, silver, titanium, germanium, platinum and palladium. The conductor material is a carbon paste. The insulator material can be a semiconductor material. The insulator material can be selected from the group consisting of titanium dioxide, copper, aluminum, nickel, gold, silver, titanium, germanium, platinum and palladium. The insulator material can comprise a titanium dioxide ink comprising $TiO_2$ nanoparticles, acetyl acetone, Triton-X-100, distilled water, ethanol, and ethylene glycol. The metal can be a metal having mobile metal ions. The metal can be selected from the group consisting of silver, copper, nickel, zinc and gold. The metal can comprise a silver ink comprising Ag nanoparticles, ethylene glycol, and water. The at least one diode can be deposited onto one or more one or more selected areas of the insulator material, the diode deposited by depositing a first material ink having a first fermi level onto the insulator material and next depositing a second material ink having a second fermi level onto the first material ink, the second fermi level being different than the first fermi level and selected to form a schottky diode. The conductor layer can be deposited as a plurality of strips onto the paper substrate, the metal layer can be deposited as a plurality of strips over the conductor layer at a non-zero angle in relation to the strips of the conductor layer to form a plurality of juxtaposed intersections between the strips of the conductor layer and the metal layer, the insulator material can be deposited onto the conductor layer between the conductor layer and the metal layer within the intersections and a diode can be deposited onto the insulator material between the insulator material and the metal layer strips at each intersection.

In an embodiment, a paper-based substrate memory device for example a WORM memory device is provided. The memory device can, comprise a paper substrate coated with a conductor material; a layer of insulator material deposited over one or more areas of the conductor material, the layer of insulator material having a thickness of more than 40 µm to less than 100 µm; at least one diode deposited over an area of the insulator material; and a layer of metal deposited over the at least one diode.

In any one or more aspects, the conductor material can form a first electrode of the memory device; and the metal material can form a second electrode of the memory device. The conductor material can be selected from the group consisting of carbon, copper, aluminum, nickel, gold, silver, titanium, germanium, platinum and palladium. The conductor material can be a carbon paste. The insulator material can be a semiconductor material. The insulator material can be selected from the group consisting of titanium dioxide, copper, aluminum, nickel, gold, silver, titanium, germanium, platinum and palladium. The metal can be a metal having mobile metal ions. The metal can be selected from the group consisting of silver, copper, nickel, zinc and gold. The conductor can be carbon paste and the paper substrate can be coated with the carbon paste using a screen printer; the insulator can be titanium dioxide and the layer of titanium dioxide can be deposited using at least one ink jet printer; and the metal can be silver and the layer of silver can be deposited using the at least one ink jet printer. The at least one diode can be comprised of two different material inks, the material inks having a difference in a fermi level of the material inks to provide a schottky diode.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

For a more complete understanding of the embodiments described herein and the advantages thereof, reference is now made to the following description, in conjunction with the accompanying figures, the components in the drawings not necessarily to scale with emphasis instead being placed upon clearly illustrating the principles of the present disclosure, briefly described as follows:

FIG. 11A illustrates a cumulative probability distribution of reset current.

FIG. 11B illustrates a cumulative probability distribution of reset voltage.

FIG. 12 illustrates curvature as a function of trench spacing.

FIGS. 14A and 14B illustrate an embodiment a WORM resistive memory by the present all-printing process. FIG. 14A illustrates an embodiment of a fabrication process in a crossbar structure combined with diodes. FIG. 14B illustrates multi-states of resistance to increase the information storage capacity of the WORM memory.

DETAILED DESCRIPTION

Described below are various embodiments of the present systems and methods for paper-based memory devices. Although particular embodiments are described, those embodiments are mere exemplary implementations of the system and method. One skilled in the art will recognize other embodiments are possible. All such embodiments are intended to fall within the scope of this disclosure. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

According to the embodiments described herein, paper-based substrate memory devices ("paper-based memory devices," "paper-based memory," or "paper memory") and methods of making the devices are described. The paper-based memory can be embodied as an all-printed paper memory including a metal-insulator-conductor structure. The metal-insulator-conductor structure can be formed from structure of silver (Ag), titanium dioxide ($TiO_2$), and carbon (C) in one or more embodiments.

Such a printed paper-based memory device (PPMD) can exhibit high reliability in terms of cycling endurance and data retention, with a tunable ON/OFF memory window (up to three orders of magnitude) via tuning the thickness of the $TiO_2$ layer. The PPMD also shows excellent device performance even under relatively extreme bending conditions, indicating its mechanical robustness. As fabricated on an adhesive label, for example, the PPMD is also capable of being tightly and reliably affixed to surfaces of any articles, including electronic devices and living subjects, with high-performance non-volatile functionality. This feature facilitates the use of memory devices as a component in a flexible, wearable, and biocompatible electronic system. Further, as compared to the relatively complex, time-consuming tasks of securely deleting data from conventional memory devices, such as degaussing or software-based erasing/overwriting, the permanent removal of data from a PPMD can be achieved simply by burning or shredding the PPMD. Finally, the printing processes described for preparing paper-based memory devices herein may be relied upon to produce memory at an estimated price of only 0.0003 cent/bit. Thus, the PPMDs described herein may facilitate the development of various types of more complex paper-based circuits.

Figure 1:
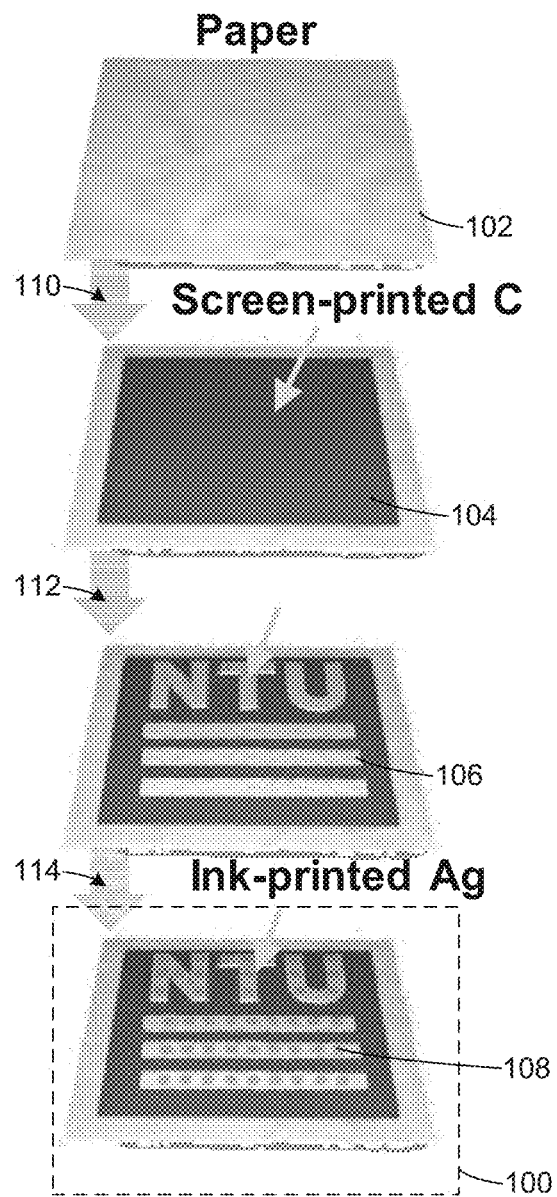
FIG. 1 illustrates a fabrication process for an example paper-based memory device according to various embodiments described herein.

FIG. 1 illustrates a fabrication process for an example paper-based memory device 100 according to various embodiments described herein. At reference numeral 110, the process includes coating or printing a conductor 104 upon one or more areas of the paper substrate 102. The conductor material can serve as a bottom electrode for the memory device. A suitable conductor is carbon that can be applied upon the paper substrate as carbon paste. Other materials suitable as the conductor include copper, aluminum, nickel, gold, silver, titanium, germanium, platinum and palladium. The conductor 104 can form a type of electrode in the paper-based memory device 100.

In an embodiment, carbon paste 104 can be coated or printed upon the paper substrate 102 by way of screen printing, although other methods of printing may be relied upon. Among embodiments, the paper substrate 102 can be embodied as any suitable type of commercially available printing paper. The type of paper used for the paper substrate 102 can be selected based on various considerations, such as grade, smoothness, foldability, cost, availability, or other factors.

The carbon paste 104 can be embodied as any suitable carbon paste consisting, at least in part, of a mixture of graphite and a pasting liquid. In this context, the carbon paste 104 can be empirically formulated (i.e., mixed) in the laboratory for certain electrical characteristics, for example, or a commercially available carbon paste can be relied upon (e.g., carbon paste product of Acheson-Henkel, etc.). Any suitable screen printing machines, mechanisms, and processes can be used. For example, a disk or drum screen printing machine can be relied upon, including but not limited to those manufactured by Houn Jien Co., Ltd. of Taiwan (e.g., HJ-55ACR, HJ-55AJ1, HJ-55AC1, etc.). The screen mesh used for screen printing can vary in material and mesh count. In one embodiment, the screen mesh can be formed from polyester having the following properties: mesh count 150 mesh/inch; mesh opening 100 μm; thread diameter 50 μm; open surface 35%; fabric thickness 80 μm.

At reference numeral 110, the process can include applying several individual coats of the conductor 104 on the paper substrate 102, followed by curing the conductor 104 between coats in the case for example of applying carbon paste. The curing can be performed for a suitable period of time to permit the carbon paste 104 to dry (e.g., 5, 10, or 15 minutes, etc.). To speed the curing process, the paper substrate 102 and carbon paste 104 can be cured in an oven or vacuum oven at a temperature of about 100° C. or another suitable temperature. The number of coats can range depending upon the roughness of the paper substrate 102, for example, or other factors. In one preferred embodiment, ten coats of the carbon paste 104 may be applied on the paper substrate 120, but it should be appreciated that greater or fewer coats may be applied.

At reference numeral 112, the process can include depositing an insulator over one or more areas of the conductor 102. The insulator can serve, in cooperation with the metal layer (described below), as an active layer, or the switching medium or layer. As a non-limiting example the process can include depositing a layer of titanium dioxide 106 as the insulator. The titanium dioxide can be deposited in an ink mixture ($TiO_2$ ink), over one or more areas of the carbon paste 104 by way of inkjet printing. The $TiO_2$ ink can be prepared, for example, by mixing 0.5-g $TiO_2$ nanoparticles of about 25 nm in diameter (e.g., by Sigma-Aldrich Co. LLC.) into a solvent of 50-μl acetyl acetone (e.g., by Alfa Aesar), 50-μl Triton-X-100 (e.g., by ACROS), 8.5-ml distilled water, 1-ml ethanol, and 0.5-ml ethylene glycol. A MicroFab JetLab4 inkjet printer system (e.g., by MicroFab Technologies, Inc.) with two piezoelectric nozzles of 50 μm in diameter, or other suitable inkjet printer systems having suitable piezoelectric nozzles, can be used for depositing the layer of titanium dioxide 106. The $TiO_2$ ink can be deposited at a temperature of about 50° C., but other temperatures may be relied upon. At reference numeral 112, the process can include applying several individual coats of the titanium dioxide 106 over the carbon paste 104, with or without permitting time for drying or curing between coats.

Semiconductor materials can also be used for the insulator 106. Semiconductor materials suitable as the insulator or active layer include zinc oxide, copper oxide, nickel oxide, molybdenum disulfide, gallium nitride, etc.

After the one or more layers of the insulator 106 have been applied, the process can include depositing a layer of metal 108 over one or more areas of the insulator. The metal layer can serve as a top electrode for the memory device. As a non-limiting example, the process can include depositing a layer of silver as the metal 108. The silver can be deposited, in an ink mixture (Ag ink) over one or more areas of the insulator 106 (e.g., titanium dioxide) by way of inkjet printing at reference numeral 114. The metal 108 can form a type of electrode in the paper-based memory device 100. A MicroFab JetLab4 inkjet printer system (e.g., by MicroFab Technologies, Inc.) with two piezoelectric nozzles of 50 μm in diameter, or other suitable inkjet printer systems having suitable piezoelectric nozzles, can be used for depositing the layer of silver 108. The diameter of the piezoelectric nozzles of the inkjet printer system may be selected to achieve a size and velocity of ejected droplets of the $TiO_2$ and Ag inks of about 50 μm, at 1000 Hz, with ejection velocities of 1.86 m/s and 2.6 m/s for the $TiO_2$ and Ag inks, respectively. In one or more aspects a suitable metal is one that can ionize with the application of voltage.

Other metals that can be used for the metal layer 108 include metals that have mobile metal ions (MMI). Metals suitable for the metal layer 108 that have mobile metal ions include copper, nickel, zinc and gold.

At reference numeral 114, the process can also include applying several individual coats of the metal 108, for example silver, with or without permitting time for drying or curing between coats. In one embodiment, the silver 108 can be cured by a sintering process at 180° C. for 1 hour, although the sintering process may be performed at other temperatures and/or for other periods of time.

A suitable Ag ink can be prepared, for example, by adding about 10 wt % Ag nanoparticles into a humectant solution (e.g., 30% ethylene glycol and 70% water). The Ag nanoparticles can have a mean diameter of about 200 nm, for example, or another suitable diameter. To help disperse the Ag nanoparticles in the Ag ink, the ink can be put into a sonication bath for 2 hours. Thus, at reference numeral 114, the process can include sonicating the Ag ink for a period of time.

Figure 2:
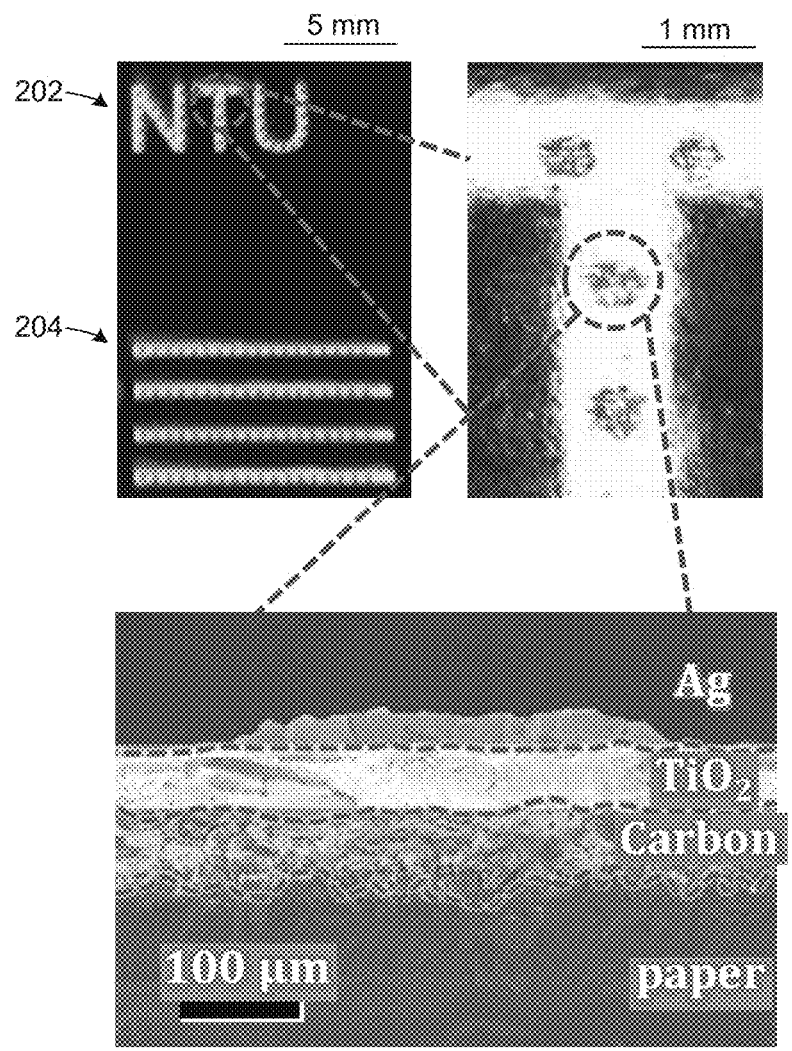
FIG. 2 illustrates representative overhead and cross-sectional photographs of an example paper-based memory device according to various embodiments described herein.

The use of inkjet printing in the process illustrated in FIG. 1 provides certain advantages. For example, the patterns of memory cells can be controlled with a high degree of freedom without relying upon lithography technique. In this context, FIG. 2 illustrates representative overhead and cross-sectional photographs of an example paper-based memory device according to various embodiments described herein. As shown in FIG. 2, memory cells can be printed as alphabetical letters 202 or dot arrays 204. Further, using inkjet printing, each layer can be deposited on paper substrates with high uniformity. The structural uniformity of the embodiments was confirmed by scanning electron microscopy, as shown in the cross-sectional photograph in FIG. 2. The lack of agglomerations in the cross-sectional photograph indicates good dispersion of each printed layer.

Because working with the relative roughness of paper substrates is necessary when fabricating printed electronic components on paper, additional coatings or polishing processes were usually required to achieve a smoother and less non-absorptive substrate surface. Such processes generally resulted in cost and recyclability compromises, however. One advantage to the process described in FIG. 1 is that, through the sequential printing processes, the roughness of paper substrates can be gradually smoothed. Additionally, as with conventional inkjet printing, each printed layer can be tightly embedded onto paper. Thus, the paper-based memory devices described herein can retain good flexibility.

With inkjet printing with a dot size of about 50 μm and pitch resolution of about 25 one memory cell can occupy a square of about 100 μm on each side, or $10^4$ bit/cm². At that density, a fully printed piece of A4 paper can store about 1 Mb of data. Using a finer inkjet printing process (e.g., super-fine ink jet (SIJ) technology), it is possible to achieve a dot resolution of <1 μm at nearly the same pitch width. Thus, the density can be enhanced by about 2500 times, and >1 Gb of data can be obtained on one A4 paper.

Figure 3A:
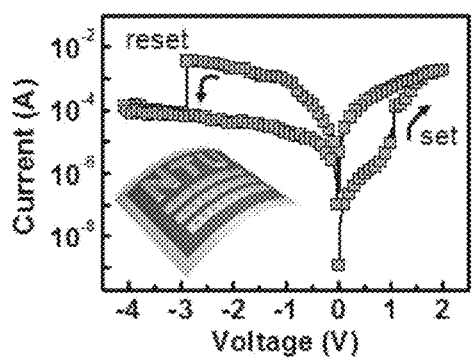
FIGS. 3A-D illustrate certain electrical characteristics of the example paper-based memory device in FIG. 1.

Turning to a discussion of the operating characteristics of a paper-based memory device prepared using the process in FIG. 1, FIGS. 3A-D illustrate certain electrical characteristics of the paper-based memory device. FIG. 3A provides typical current-voltage (I-V) switching characteristics of the paper-based memory device. After preparation, paper-based memory devices are in a high resistance (HRS or OFF) state and can be directly operated without an electroforming process, which may be beneficial from the viewpoint of RRAM circuit operation. Without electroforming (e.g., forming or changing the resistive state), the paper-based memory devices described herein show relatively uniform performance and reproducible switching operation by both DC voltage sweeping and AC voltage pulses.

As for electroforming, by applying a positive set voltage bias exceeding about 1 V, the current across the paper-based memory device abruptly increases with a resistive switch from HRS to low resistance (LRS or OFF) state. In the paper-based memory device, the ON state is retained after the applied electroforming bias is turned off, exhibiting a non-volatile memory behavior. To turn the device OFF, a negative electroforming bias is applied (e.g., reset voltage of about −3V), inducing a decrease of current and turning the memory device back to the HRS. In one or more aspects, a voltage in the range of about −3V to about +2V can be applied to store data. The switching mechanism follows from electrochemical metallization, due at least in part to electrochemical dissolution of a mobile metal (e.g. Ag) to perform the ON/OFF switching operation. The state of the $TiO_2$ layer cannot itself be switched without the deposition of the inkjet-printed Ag electrodes, which demonstrates the role of Ag as the source for conducting nanofilaments.

The Ag/$TiO_2$/C paper-based memory device described herein can be referred to as a conductive-nanobridge RRAM, recognized as the formation and the rupture of the Ag conductive nanobridge within the dielectric $TiO_2$ electrolyte. As such, a porous structure featuring high permeability for metal atoms/ions can be preferable. Since the $TiO_2$ ink is made of nanoparticles, the structure is naturally porous and thus provides more chances to form the conductive nanobridges. This can result in a forming-free characteristic of the paper-based memory devices with a device yield of over about 90%.

Figure 3B:
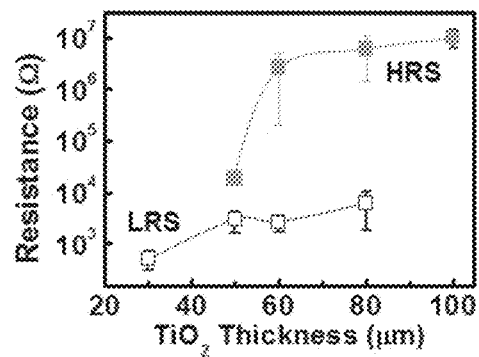

An important consideration for PPMDs is their tunable memory window. The memory window can be tuned by modulation of the thickness of the $TiO_2$ layer, as controlled using inkjet printing times, for example. FIG. 3B shows the high (HRS) and low (LRS) resistance state values as a function of thickness of printing $Tio_2$ layers, with the ON/OFF ratio (the memory window) ranges from 10 to $10^3$. It shows the $TiO_2$ layer can be <100 μm. In other aspects, the $TiO_2$ layer can be in the range of 60 μm to 80 μm.

It shows that a thin $TiO_2$ layer (e.g., thickness<40 μm) results in no memory window, with the device in the LRS state due to the Ag electrodes penetrating directly through the $TiO_2$ layer to the C electrodes. When the $TiO_2$ layer is thick enough (e.g., thickness>50 μm), the memory window appears and enlarges with $TiO_2$ layer thickness. As the $TiO_2$ layer thickness is more than about 100 μm, the devices become pure insulators and cannot be operated. In one or more aspects the thickness of the insulator layer can range from 40 μm to less than 100 μm. In one or more other aspects the thickness of the insulator layer can range from less than 100 μm to more than 40 μm. In other aspects, the thickness of the insulator layer can range from 45 μm to 95 μm, 50 μm to 90 μm, or 55 μm to 85 μm. Taking advantage of the tunable nature of inkjet printing techniques, the tunable window provides a broad range of reading margins according to various requirements and sensitivities of systems. A $TiO_2$ layer of about 50 μm or more in thickness can be preferred to allow paper-based memory devices to perform with a high ON/OFF memory window.

Figure 3C:
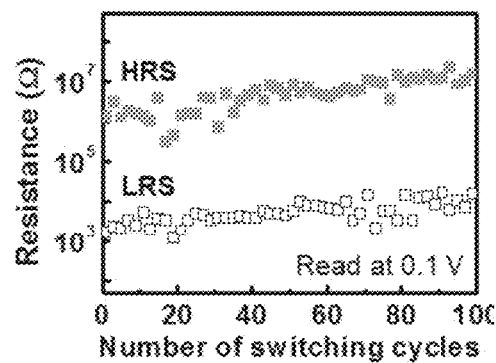
Figure 3D:
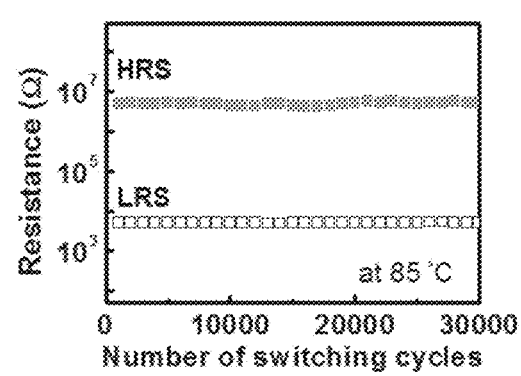

As to programmable capability and endurance, a PPMD was successively switched between HRS and LRS states 100 times during an endurance Test, and the results are shown in shown in FIG. 3C. During the 100 endurance cycles, both the HRS and LRS states retained their resistance values without a significant change in reading bias, showing reproducible and repeatable switching capability. This state retention property was also characterized at 85° C., and the results are shown in FIG. 3D. The resistance ratio of resistive states were retained up to $3\times10^4$ s at 85° C. without degradation, showing that the PPMD is capable of maintaining data integrity under harsh environment of relatively high temperatures. In testing, PPMDs are capable of maintaining data integrity at temperatures up to 150° C., as described in further detail below.

The flexibility of PPMDs, for foldable and wearable applications, is of some practical importance. As shown in frame (a) of FIG. 4, a bending test was performed to verify if PPMDs can be reliably operated under bent conditions. The bending test was conducted by mounting the devices on homemade stages with confined gaps. The degree of bending is expressed by the radius of curvature (r) between two edges of the substrate, as shown in the inset of frame (a). Cycle-to-cycle and device-to-device resistive switching behaviors were tested for 5 cells. For r>20 mm, the same switching characteristics as that for a flat condition were observed. For r=10 mm, the switch window decreased by about 20% relative to the flat condition. It is noted, however, that the memory window is reversible as a PPMD returns from r=10 mm to the flat condition. To highlight the mechanical robustness of PPMDs, memory performances were monitored after repetitive bending for more than 1000 times with a bending radius of about ~10 mm, and the results are shown in frame (b) of FIG. 4. The suitable stability shown in frame (b), even after successive bending with r=10 mm, confirms the reliability of PPMDs.

The ability of PPMDs to be labeled or affixed on surfaces of various articles can be another important feature. In this context, PPMDs were fabricated on an adhesive label using the process described in FIG. 1, and then affixed to different objects. The PPMDs were tested and triggered by AC pulses after adhesion. The equivalent circuit is shown in frame (c) of FIG. 4. The writing bias is a positive pulse of 6 V and width of 100 μs, and the erasing bias is a negative pulse of 3 V and width of 200 μs. The reading voltage is 0.5 V. Operating voltages were applied on the top silver electrode, and the bottom carbon electrode was grounded. During the measurement, the positive bias is defined as current flow with direction from the top to the bottom electrodes, and the negative bias was defined as the direction from the bottom to the top electrodes. A resistance of 500Ω was applied to restrain the current (compliance current) flowing through the devices. The electrical pulse was trigged by a function generator, and the resistance was measured by a power-meter.

Figure 4:
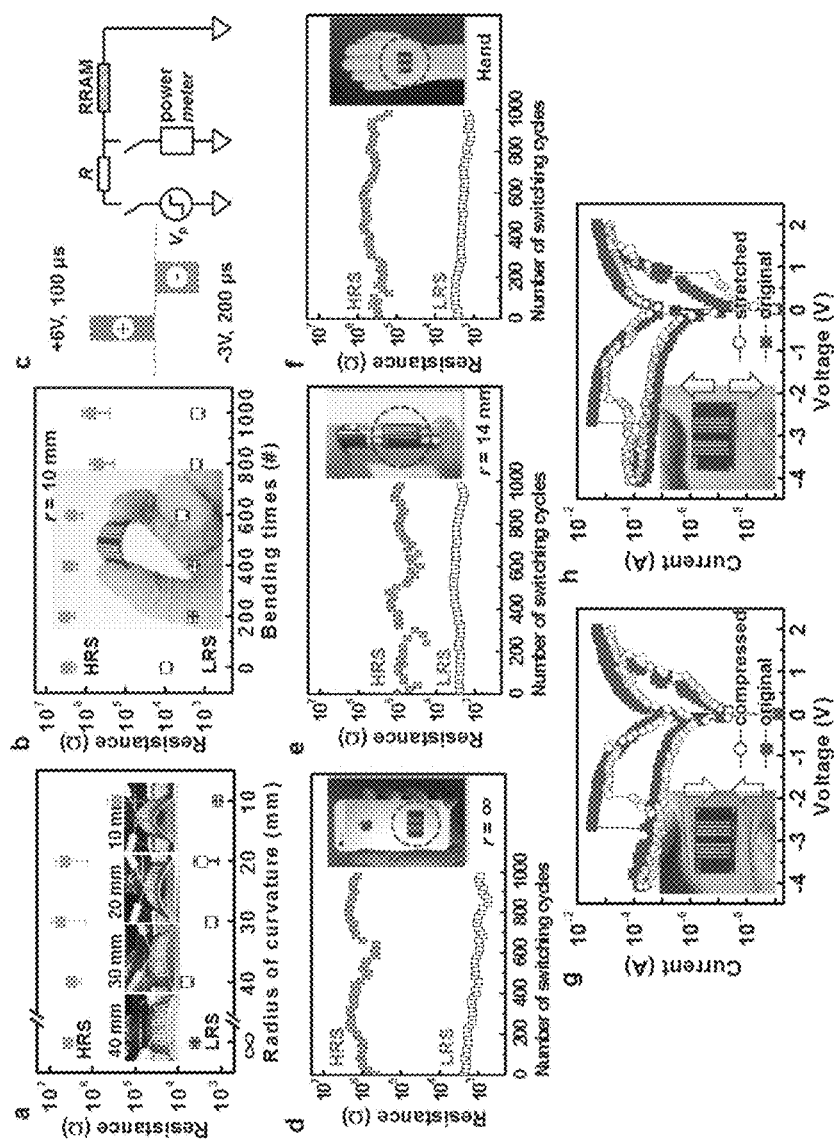
FIG. 4, frames (a)-(h) illustrate certain characteristics of the example paper-based memory device in FIG. 1 and associated circuitry during a bending test.

Frames (d) and (e) of FIG. 4 show the switching endurance of PPMDs labels on different solid surfaces, including a smart phone (r=∞, flat surface) and a battery (r=14 mm). As the input voltage pulses were applied for 1000 times, the resistive values responding to ON and OFF states were recorded. The ON/OFF ratio for the flat surface in frame (d) is slightly larger than the curved surface in frame (e). The result indicates that the PPMD can be readily implemented into planar or non-planar electronic devices with stable switching properties.

As shown in frames (f)-(h) of FIG. 4, the use of PPMDs on human skin was tested. Because paper substrates are formed of cellulose, they are biocompatible and suitable for wearable applications. The storage capability of PPMDs affixed to the back of the hand was shown to be successful, as demonstrated in frame (f) of FIG. 4. PPMDs stuck to un-deformed skin also show stable switching behaviors for over 1000 switching cycles, as demonstrated in frame (f). As shown in frame (h) of FIG. 4, PPMDs on compressed and stretched skins are still switchable and operate normally. Such tests demonstrate that PPMD stickers could enable the use of memory devices as a component in a flexible, wearable, and biocompatible electronic system.

To secure sensitive data, data removal can be an important issue, particularly in military or commercial uses. Typically, data elimination is carried out by relatively complex and/or time-consuming physical destruction, insecure degaussing, and/or software-based erasing/overwriting. Owing to the mechanical robustness of semiconductor memories and advanced recovery techniques, permanent data elimination may be difficult to achieve in many conventional memory devices.

One advantage of the paper-based memory devices described herein is disposability. Here, two examples are shown to demonstrate the ease of data removal for paper-based memory devices. First, the data can be totally and irreversibly eliminated by heating a PPMD to over 250° C. or igniting it. The temperature-dependent switching performance of a PPMD is shown in frame (a) of FIG. 5. Below 150° C., PPMDs can retain the ON/OFF memory window without significant degradation, demonstrating their stability under extreme weather conditions. It is noted that paper substrates do not deform as much as low-cost plastics upon heating, which can be an important issue for applications in harsh environments. At temperatures higher than 150° C., the memory window gradually shrinks and the difference between the ON/OFF states becomes indistinguishable as the resistance of the HRS and LRS states was decreased and increased with temperature, respectively. Then, at higher temperatures (>250° C.), the cellulose paper fibers darkened and decomposed within five seconds, leading to a permanent failure of the device, as shown in frame (b) of FIG. 5.

Figure 5:
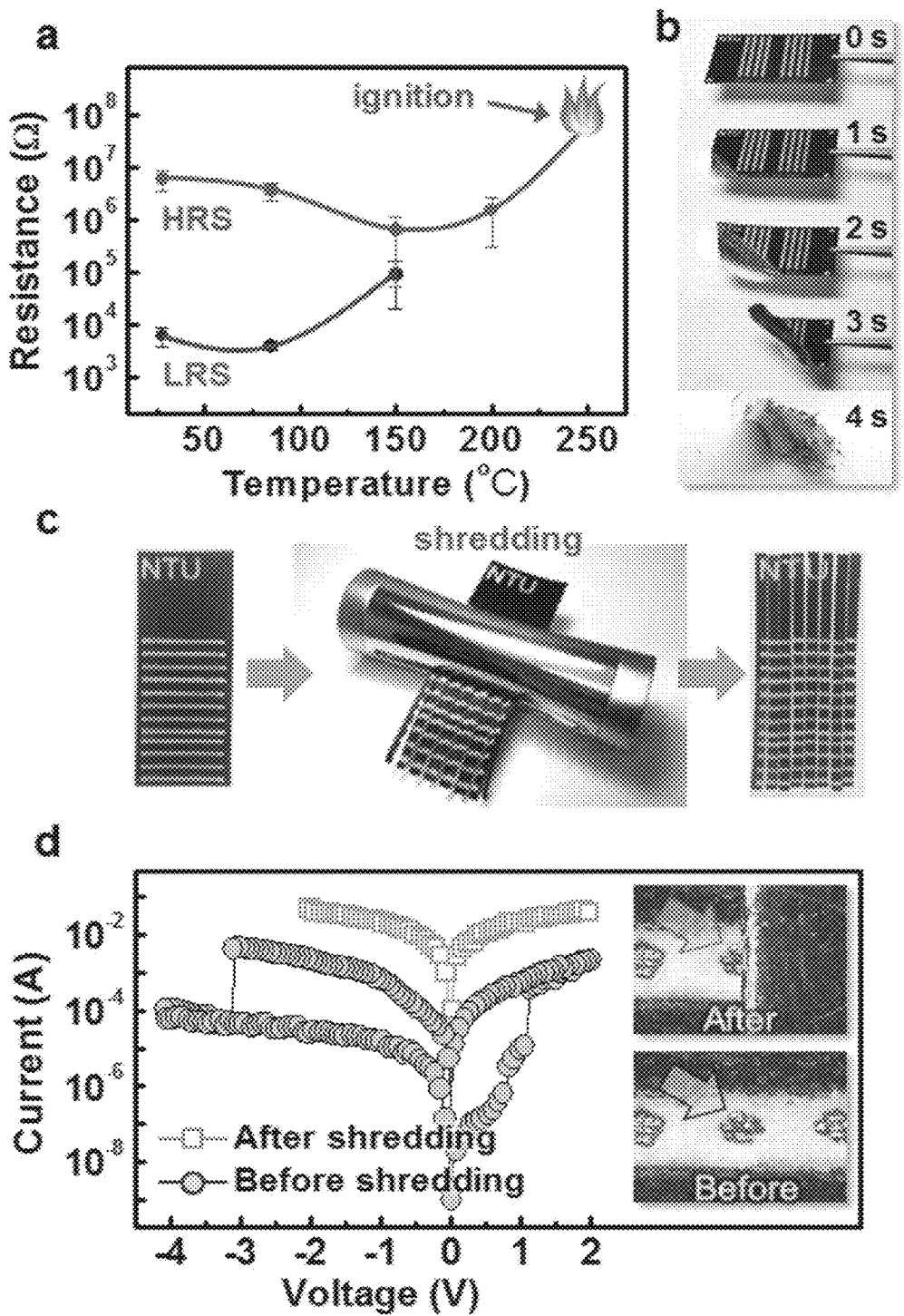
FIG. 5, frames (a)-(d) illustrate certain characteristics of data removal for the example paper-based memory device in FIG. 1 during various security tests.

Paper shredding is another efficient way to securely remove data from PPMDs, as shown in frame (c) of FIG. 5. With traditional paper, shredders are relied upon to destroy documents. However, in some cases, shredded paper can be reconstructed by piecing together a series of shredded segments of paper, using the original print as a guide. On the other hand, when PPMDs are shredded, each piece or segment is likely to look substantially the same, as shown in frame (c). Thus, it is difficult to reconstruct the PPMD. Frame (d) in FIG. 5 is an example showing the I-V characteristics of a PPMD before and after shredding. A PPMD was tested to ensure its operation status before shredding. Then, the PPDM was shredded by a shredder and measured again. The paper memory device failed to switch and showed the nature of pure resistance (~58Ω) after shredding, which is even lower than the LRS before shredding, indicating a leakage through the $TiO_2$ nanoparticle layer. This result shows that the shredding can lead to permanent data elimination.

The use of paper-based electronics is motivated by the ability for rapid manufacturing and cost effectiveness, among other factors. For instance, paper is produced at a speed exceeding $10^6$ m$^2$/hour and at a cost of about $0.06 cent/inch$^2$, which is about 5 orders faster and 3-4 orders cheaper than those of monocrystalline Si wafers, the most commonly-used substrates in the electronic industry. Combining the utilization of paper substrates with printing techniques without the need for lithography leads to a time- and cost-effective manufacturing scheme for paper memory. Moreover, the paper-based substrate memory devices described herein have an estimated cost of about 0.0003 cent/bit. As compared to other devices, paper RFID tags (1 bit) fabricated on polyethylene terephthalate (PET) substrates are estimated to cost about 3 cent/bit, credit-card-sized ID tags (96 bits) on paper have a cost of about 0.021 cent/bit, and a sensors or authentication systems on paper substrates cost about 0.1 to 1 cent. These higher costs may be attributed to complex fabrication processes and/or larger areas per device, for example. The time- and cost-effective scheme of all-printed paper memory employed according to the processes described herein offers a good replacement to those devices.

As outlined above, a non-volatile memory on paper is described using an all-printing approach. The paper-based memory shows good rewritable switching properties and the capability to retain information at various temperatures. The paper-based memory exhibits stable endurance under bending conditions, demonstrating the characteristics of flexible electronics. Memory labels were also fabricated and affixed to other electronic devices and biological objects, showing integrative and biocompatible characteristics. Finally, secure data disposal or removal was demonstrated using the paper-based memory.

In a further aspect of our paper-based memory devices, we can provide write once read many (WORM) memory devices. WORM memory allows messages to be written in memory a single time and prevents data erasing. The memory are deliberately not rewritable. They are intended, for example, to store data for a purpose in which the data is not to be tampered or erased by accident. Because of this feature, WORM memory have long been used for the archival of organizations such as government agencies or large enterprises. In addition, WORM memory can work as a driver on a system setting in a computer or circuit.

In one or more aspects, extending our all-printed paper memory from single cell to multibyte WORM paper-based memory (see, e.g., FIG. 14B) can be realized through the design of a crossbar structure combined with diodes which can be accomplished by our all-printing process. The state of resistance in the WORM memory can be decided by adjusting the thickness of the switching medium (i.e, the insulator) or changing the insulator materials during the printing process. A diode WORM memory structure can be associated with each memory cell to prevent a sneaky path (or sneak path) condition from occurring in the crossbar structure. It can also provide a certain and fixed signal to drive devices in cases of system setting. The design of WORM resistive memory by our all-printing process can satisfy the demands in system setting and have the benefit of mass storage, energy saving and direct driving. Furthermore, the paper-based memory fabricated by our all-printing approach can allow mass production. For example, in setting up roll to roll equipment, the memory device(s) can be completely fabricated by a sequence of printing processes, which are low-cost and rapid. We describe below how our single-cell paper memory can be extrapolated to provide WORM memory devices.

In our discussion above we demonstrated how nonvolatile RRAM electronics can be combined with paper to provide a paper-based memory with metal-insulator-conductor structures. The RRAM exhibits a bipolar-switching behavior. The ON/OFF switching operation of the memory can be controlled by the electrochemical metallization. The paper-based memory has many advantages, one being the tightly embedding of each printed layer on the paper substrate allowing great flexibility of the device.

FIG. 1 described in more detail above, shows a schematic of an aspect of our paper-based memory. First, a conductor material (for example, carbon paste) can be coated on a paper substrate. The conductor material can serve as the bottom electrode(s). Next, an insulator material or switching medium (for example, $TiO_2$ nanoparticles) can be printed on the conductor material using an inkjet printing process. After the insulator layer, the metal layer (for example, silver nanoparticle inks) can be deposited. The metal layer can serve as the top electrode. In fabricating printing electronic components on paper, the roughness issue can be important. Generally, additional polishing or coating processes are often required to get a smooth and non-absorptive surface. However, it would increase the cost and loss recyclability in the same time. In our case, the roughness is progressively smoothened as inkjet-printing layers on top of the paper substrate by a sequential printing approach (FIG. 2), which is hard for any single printing processes. This concept can be applied to our WORM memory devices.

Generally speaking, scaling down the dimensions of a memory cell can be advantageous for commercial applications. Effectively dividing the materials to isolate neighbor cells in crossbar arrays can work well in advanced cell architecture, for example in high cell density crossbar arrays in plane structure. The characteristics of high cell density also correspond to minimizing the feature size of the device. Nevertheless, a crossbar array may lead to unwanted current leakage paths which are also called sneaky path. The sneaky path can result in the misreading of memory state(s) which can significantly influence the operation of the memory. In order to solve this problem, additional diodes can be combined with a memory cell. The resistance of sneaky path can be dramatically increased by the barriers from the diodes. As a result, the circuit system can precisely read the resistance states of the memory.

Figure 13:
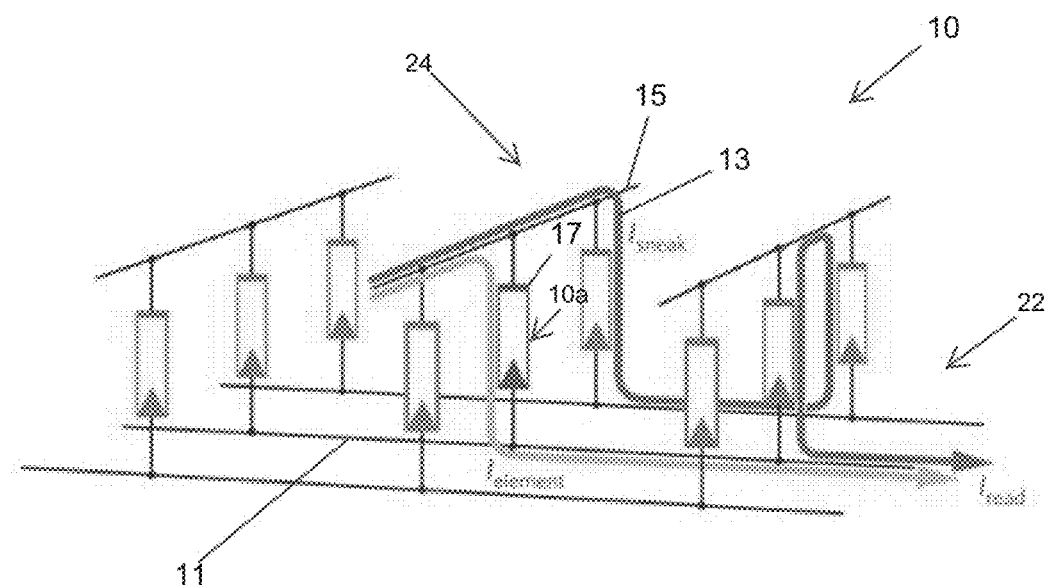
FIG. 13 illustrates diodes in a crossbar structure of a RRAM to prevent sneaky path.

An example of the sneaky path in a memory crossbar structure is shown by the line 13 in FIG. 13. For the example in the memory architecture 10 of FIG. 13, different word-lines 22 observe different small differences in voltage (e.g., because the program pattern in the array is different). For instance, the middle wordline connected to selected RRAM memory cell 10a can experiences a given voltage, whereas the top and bottom wordlines 24 connected only to un-selected RRAM memory cells can experience a lower voltage. This difference in voltage can result in one or more several sneak path currents, such as path current 13, throughout memory architecture 10.

The crossbar memory array 10 can include a parallel array of bottom electrodes 11 extending along a first direction. In an embodiment, the bottom electrodes 11 can include the bottom conductor material. A parallel array of top electrodes 15 can extend along a second direction juxtaposed above and intersecting the bottom electrodes 11. The top electrodes 15 can include the metal layer capable of providing mobile metal ions. In an embodiment, the top electrodes and the bottom electrodes are orthogonal to each other.

Each intersection of the two electrode arrays can define a two-terminal resistive memory cell. The memory cell at each intersection can include the two electrodes 11, 15 separated by a switching medium (insulating layer). The switching layer can include the insulating medium, and in the WORM memory embodiment also a diode 17. The switching layer or structure can be the same width or narrower than the bottom electrode 11. In some embodiments, each memory cell in a crossbar memory array can store a single bit; in other embodiments, the memory cells can exhibit multi-level resistance thereby allowing storage of a plurality of bits at each cell, as depicted in FIG. 14B.

To promote all printed paper memory into mass production, plural storage spaces can be advantageous for use in paper-based electronics. The crossbar structure of FIG. 13 can be a solution for providing large amounts of database. To drive the paper device, it usually requires a fixed signal in system setting. We provide a WORM resistive memory by our all-printing process. The resistance state of the WORM can be determined by the thickness of active layers during the printing process. The various resistance states of each cell in the crossbar structure can be combined into a particular output signal, which can drive the paper device directly without writing memory. Implanting diodes 17 in each memory cell can prevent the sneaky path from occurring in the crossbar structure. Preferably, the operating voltage of the memory cell and the diode should match each other. A lower barrier of the diode can lead to the misreading of memory states caused by a sneaky path, and a higher barrier can result in the failure to switch resistance state.

To achieve this objective, we can quantify the resistive states of the insulator layer of the memory device (for example, $TiO_2$ or other semiconductors layer) in the memory cell as a function of thickness, which can be controlled by printing times. According to the output signal, the resistance and thickness of active layer can be determined and obtained. Then, a suitable diode can be fabricated as a selector to prevent the cross-talk during reading. I-V characteristics of the diode can be adjusted and tested to make sure the operating voltages are matched between memory cell and the diode. After the explicit measurement, the WORM memory can be realized by ink-jet printing in, for example, a crossbar structure. Moreover, WORM memory can further increase the information storage capacity by establishing different thicknesses of the insulator layer, which can result in the multi-states of resistance in memory cell.

An embodiment of a fabrication process and corresponding multi-states of WORM memory are shown in FIG. 14. A paper substrate can be provided as described above. Conductor material can then be coated or deposited onto the paper substrate, as shown in FIG. 14A.1. The conductor material can be as described above and applied as described above. In one or more aspects the conductor material, forming the bottom or first electrode(s) can be deposited onto the paper substrate in the form of a plurality of strips. These strips can, preferably, be deposited parallel to each other. Insulator material, such as described above, can then be deposited on one or more areas or locations of the conductor material or bottom electrodes, as depicted in FIG. 14A.2. The material and the manner of application or depositing of the insulator material can also be in the manner as described above. At least one diode, and preferably a plurality of diodes, can be printed onto the insulator material, as depicted in FIG. 14A.3. The one or more diodes can be formed of at least two material inks, the inks, the two inks having a different fermi level between them so as to build or provide a schottky diode. Since the diodes can be comprised of inks having different fermi levels the printing of the diodes can be in two steps in which a first ink having a first fermi level is printed onto the insulator material and then a second ink having a second fermi level is printed onto the first fermi level ink, thereby forming the one or more diodes. A metal layer can be deposited or printed over the one or more diodes, such as depicted in FIG. 14A.4. The metal layer provides a conductor material to form second electrode of the memory device. The metal layer can be comprised of materials and deposited as described above. In one or more aspects, the metal layer, identified as top electrodes in FIG. 14A.4, is juxtaposed over the bottom conductor material (first electrodes) in a manner to form a plurality of juxtaposed intersections between the top and bottom electrodes. In an aspect the top and bottom electrodes can each be formed as a plurality of strips juxtaposed at a non-zero angle in relation to each other. In an aspect the top and bottom electrodes can each be formed as a plurality of strips juxtaposed at a non-zero angle to each other. In an aspect the top and bottom electrodes can each be formed as a plurality of parallel strips juxtaposed at right angles to each other. The insulator material and diode(s) can be provided between the top and bottom electrodes at one or more of the juxtaposed intersections, such as depicted in FIG. 14A.4, thereby forming a paper-based all printed WORM memory device.

Turning to FIG. 14B, a WORM memory array including multiple states of resistance among the cells in the array is shown. Using multiple states of resistance among the cells can increase the capacity of information storage. To realize this concept, first, the resistive states of the $TiO_2$ (or other semiconductor material) layer in the array are quantified and/or characterized for resistance as a function of $TiO_2$ layer thickness. $TiO_2$ layer thickness can be controlled by printing times, for example.

Figure 10A:
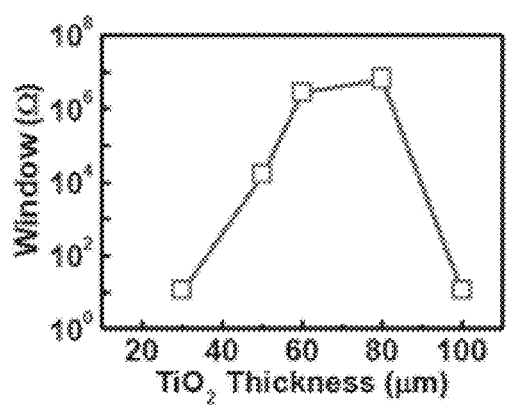
FIG. 10A illustrates the memory window of paper memory as a function of titanium dioxide thickness.

Referring back to FIG. 10A, representative memory windows of cells as a function of $TiO_2$ layer thickness are shown. Specifically, as shown in FIG. 10A, the operating memory window (the ratio of HRS and LRS) of cells with $TiO_2$ thicknesses of 50, 60, and 80 µm are 6.2, 857.3, and 985.7, respectively. Thus, using different $TiO_2$ thicknesses for individual cells in a WORM memory array results in different programmed "states" for cells having different $TiO_2$ thicknesses.

Thus, as one example, the WORM memory array shown in FIG. 14B can be realized by using a 55 µm-thick $TiO_2$ layer for the "00" cells, a 65 µm-thick $TiO_2$ layer for the "01" cells, a 75 µm-thick $TiO_2$ layer for the "10" cells, and a 85 µm-thick $TiO_2$ layer for the "11" cells. Each of the 55 µm, 65 µm, 75 µm, and 85 µm $TiO_2$ layers corresponds to a different HRS resistance state and, accordingly, bit combination. Before electroforming (e.g., forming or changing the resistive state), the paper-based memory cells and devices described herein show relatively uniform performance and are in a high resistance (HRS or OFF) state. As for electroforming, by applying a positive set voltage bias exceeding about 1 V, the current across the paper-based memory cell abruptly increases with a resistive switch from HRS to low resistance (LRS or OFF) state.

Additional Supporting Disclosure and Details

Additional details regarding the paper-based memory devices described herein (and variations thereon) are provided below for further reference.

As for the zeta potential of titanium dioxide ink as a function of pH values, $TiO_2$ nanoparticle powder (e.g., Sigma System, Inc.), having a diameter of about 25 nm, was ground and mixed with distilled water. The mixture was dispersed in a sonication bath for several hours. Then, HCl and NaOH solutions were added to adjust the pH value of the $TiO_2$ ink, and the zeta potential was characterized using a Zetasizer Nano system (Malvern Instrument) at a concentration of 0.025 wt %. The sedimentation rate of the nanoparticles was tested by a centrifuge at 3000 rpm.

Figure 6A:
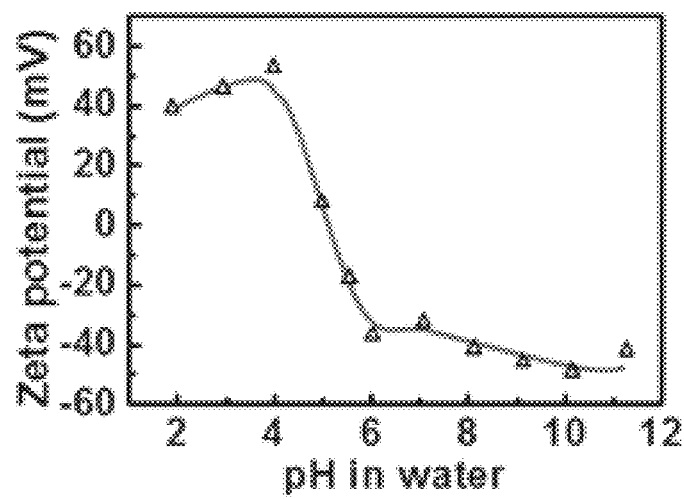
FIG. 6A illustrates zeta potential as a function of pH values in titanium dioxide ink.
Figure 6B:
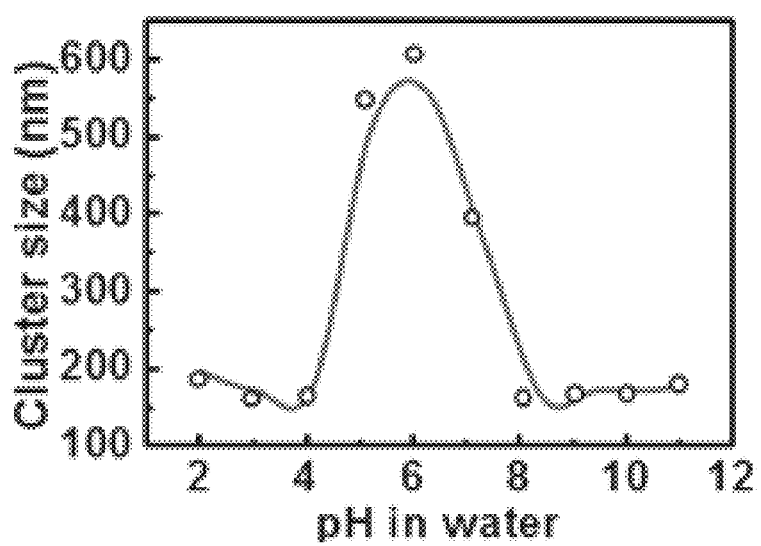
FIG. 6B illustrates the size of titanium dioxide clusters as a function of pH values in titanium dioxide ink.

FIG. 6A illustrates zeta potential as a function of pH values in titanium dioxide ink. The zeta potential is 40 mV at pH=2, and stays constant until the pH value increases to 4. As the pH value increases, the value undergoes a transition from 40 mV (pH=4) to −40 mV (pH=6). The zero charge point is found at pH=5.2, corresponding to the isoelectric point of the ink. A similar trend was also observed in the size of cluster as a function of pH value. FIG. 6B illustrates the size of titanium dioxide clusters as a function of pH values in titanium dioxide ink. In FIG. 6B, the cluster size, or hydraulic diameter, is measured to be about 200 nm for pH<4 and pH>6. Between pH=about 4 to 6, the aggregation of nanoparticle is more severe, leading to a relatively large cluster size (e.g., 500 nm). This may be attributed to a reduction of surface potential in this pH environment, where the electrostatic forces are less effective. Therefore, the $TiO_2$ can be adjusted to pH=4 in some embodiments.

Figure 7:
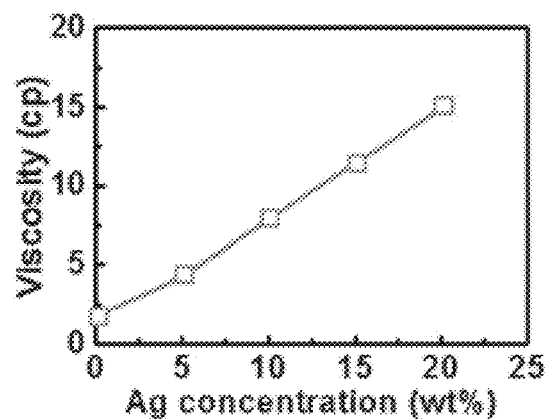
FIG. 7 illustrates the viscosity of the silver ink as a function of silver content represented in weight percentage.

As for the viscosity of silver ink, Ethylene glycol can be used as a solvent to reduce the evaporation rate and avoid blocking at the nozzle of an ink jet printer. It can also modulate the viscosity of ink for printing purposes. FIG. 7 illustrates the viscosity of the silver ink as a function of silver content represented in weight percentage. FIG. 7 shows the viscosity of the silver ink at 25° C. as a function of silver content, and the result clearly indicates that the viscosity increases with silver content. In certain embodiments, 10 wt % of silver ink can be employed with a viscosity of about 8 cp.

Figure 8A:
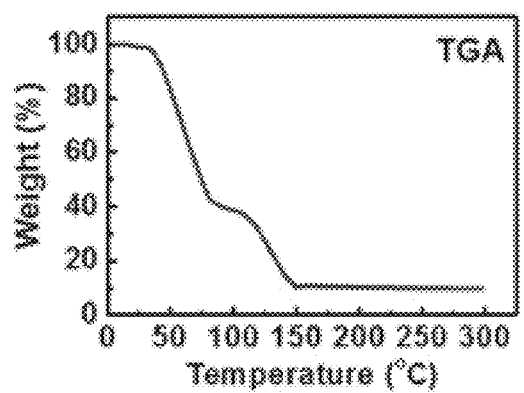
FIG. 8A illustrates a thermo-gravimetric analysis.
Figure 8B:
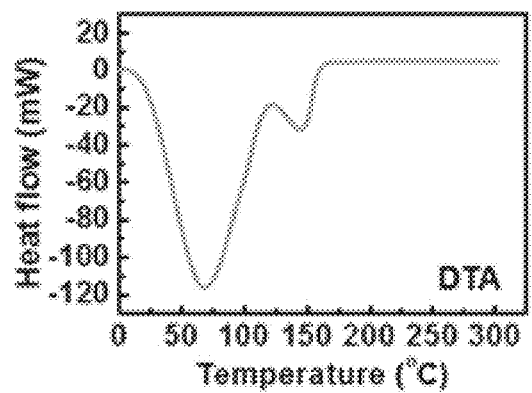
FIG. 8B illustrates a differential thermal analysis for 10 wt % silver ink heated in the air at a rate of 10° C./min.

As for the sintering parameters of the silver ink, a thermo-gravimetric analysis (TGA) and differential thermal analysis (DTA) were performed to determine a suitable sintering temperature. FIG. 8A illustrates a thermo-gravimetric analysis. Particularly, FIG. 8A shows the TGA for the 10 wt % silver ink heated in the air at a rate of 10° C./min. Continuous weight loss was observed at the temperatures ranging from 25 to 300° C. FIG. 8B illustrates a differential thermal analysis for 10 wt % silver ink heated in the air at a rate of 10° C./min. From the result shown in FIG. 8B, two broad valleys are presented in the curve, indicating that the solvents keep evaporating below 100° C. and 160° C. The two featured temperatures correspond to the boiling point of distilled water (100° C.) and ethylene glycol (160° C.). Therefore, in certain embodiments, the sintering temperature may be set at about 180° C.

Figure 9:
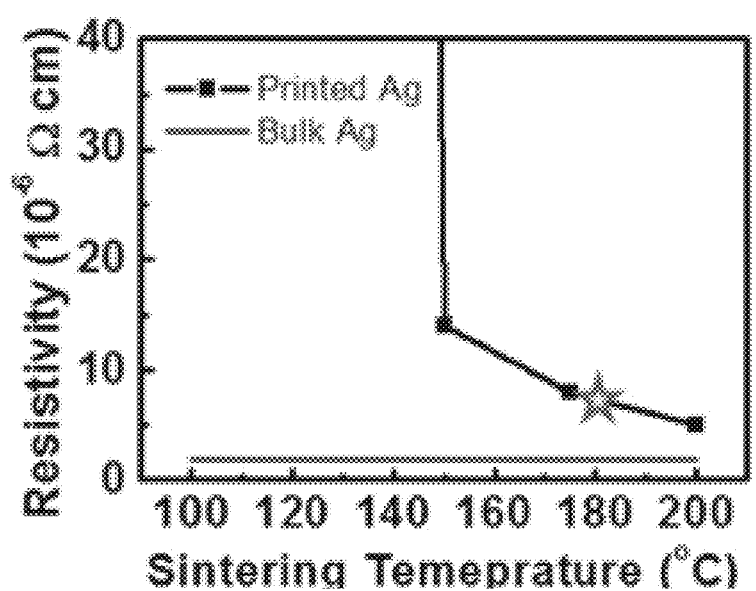
FIG. 9 illustrates a comparison of resistivity between bulk silver and inkjet-printed silver as a function of sintering temperature.

As for the electrical characteristics of the inkjet-printed silver ink, FIG. 9 illustrates a comparison of resistivity between bulk silver and inkjet-printed silver as a function of sintering temperature. The resistivity of the printed silver line (150 µm in length, 10 µm in width, and 300 µm in thickness) was characterized by a two-probe measurement. The results show that the as-printed silver line is nonconductive after drying at about 50° C. After baking at a temperature higher than about 150° C. for 1 hour, the resistivity of the sample drops to about 14 µΩcm, which is about 8.7-fold of the bulk silver (at about 1.6 µΩcm). Thus, the resistivity of the inkjet-printed silver decreases with the sintering temperature. In this context, to insure the conductivity of the silver electrode as well as the integrity of the paper substrate, the sintering temperature for the fabrication of the memory devices in various embodiments may be about 180° C.

Figure 10B:
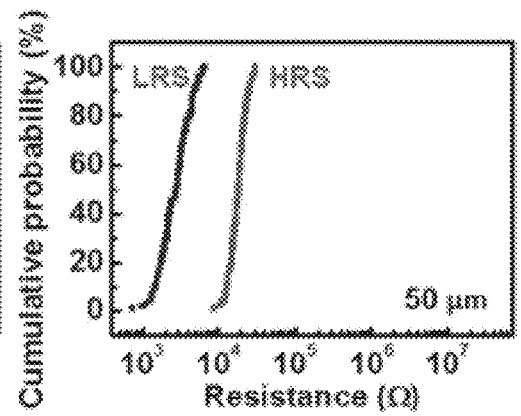
FIGS. 10B-D illustrate cumulative probability distribution functions of high and low resistance states as a function of titanium dioxide thickness, for thickness of 50 μm, 60 μm, and 80 μm, respectively.
Figure 10C:
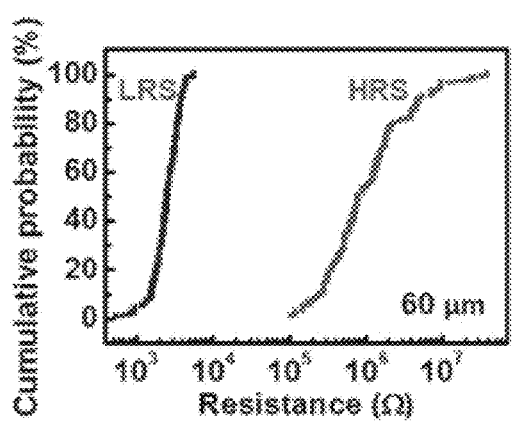
Figure 10D:
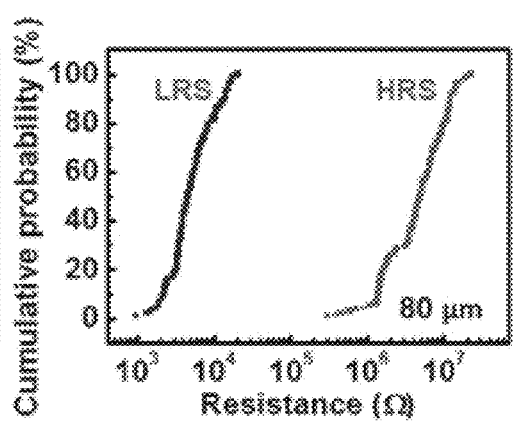

As to the switching parameters of the paper-based memory devices described herein, FIG. 10A illustrates the representative memory windows of the devices as a function of titanium dioxide thickness. As shown in FIG. 10A, the operating memory window (the ratio of HRS and LRS) of the devices with $TiO_2$ thicknesses of 50, 60, and 80 μm are 6.2, 857.3, and 985.7, respectively. To verify the operating stability of the devices, cumulative probability distribution functions of the HRS and LRS states for the 50, 60, and 80 μm $TiO_2$ thickness devices were plotted, as shown in FIGS. 10B-D. All the devices show a concentrative distribution of LRS with a small coefficient of variation (COV, standard deviation divided by mean), while the cumulative probability of HRS for all devices exhibits a clear distinction, as shown among FIGS. 10A-D.

The switching parameters of paper-based substrate memory devices are also summarized in Table S1 below.

TABLE S1

| $TiO_2$ thickness (μm) | HRS (Ω) | LRS (Ω) | HRS/LRS | $V_{reset}$ (V) | $I_{reset}$ (mA) |
| --- | --- | --- | --- | --- | --- |
| 50 | μ = 18.7k COV = 24% | μ = 3.0k COV = 44% | 6.2 | μ = −3.7 | μ = 22.3 |
| 60 | μ = 2.3M COV = 173% | μ = 2.7k COV = 36% | 851.9 | μ = −3.2 | μ = 18.4 |
| 80 | μ = 6.1M COV = 75% | μ = 6.2k COV = 67% | 983.9 | μ = −2.5 | μ = 7.3 |

The small COV for the LRS of all devices is evidence of the formation of one or more conducting bridges capable to maintain relatively stable resistive states. For the HRS, the COVs for 50, 60, and 80 μm TiO2 thickness devices are 24%, 173%, and 75%, respectively. The fluctuation of the HRS could be attributed to the roughness of the $TiO_2$ layer, and with further optimization the fluctuation may be reduced. A $TiO_2$ layer with a thickness of 80 μm that exhibits an acceptable COV may be used in some embodiments.

FIG. 11A illustrates a cumulative probability distribution of reset current. More particularly, FIG. 11B shows reset current and voltage as a function of $TiO_2$ thickness. The distribution reveals that a thinner $TiO_2$ layer requires higher reset voltage and current. Thus, it is noted that an increase in thickness may lower the required voltage and current and reduce the energy consumption needed for memory switching.

To perform the bending tests described herein, paper-based memory devices were mounted on holders and characterized at the same time. The paper substrates were first trimmed to a length of about 30 mm and then inserted into trenches of the holders. To the extent that the spacing of the trenches was smaller than the length of paper substrates, the paper substrates were curved. By varying the spacing of the trenches (l), the curvature (r) of the flexible paper memory can be determined. According to the relations: $r=15$ mm/$sin^{-1}(½)$, the curvature as a function of trench spacing is defined, as shown in FIG. 12.

As to the estimates of fabrication speed, modern paper machines can produce a sheet of about 10 m in width and operate at speeds of more than 100 km/h. This fabrication speed, in area, is 106 $m^2$/h. Si monocrystals are fabricated with a crystal growth rate of about 1 mm/min. For an 18-inch Si fabrication process, the expected thickness of the wafer is about 925 μm, which results in an estimated speed of 10 m2/h.l As to the estimates of cost, 1 g ($0.9) of silver nanoparticles was mixed into 10 ml solvent to produce the silver ink. Each silver droplet is 50 μm in diameter, equivalent to a volume of $6 \times 10^{-11}$ L. Silver droplets for two times are required for the formation of a top electrode. The cost of the silver electrode is about 0.001 cent for a bit. A 0.5 g ($0.06) weight of $TiO_2$ nanoparticles was mixed into 10 ml solvent to produce the $TiO_2$ ink. Each $TiO_2$ droplet is 50 μm in diameter, equivalent to a volume of $6 \times 10^{-11}$ L. To fabricate the active layer, at least about 50 $TiO_2$ droplets may be required for a bit, which corresponds to a cost of about 0.002 cent. Thus, the cost for a bit is about 0.003 cent.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

Unless defined otherwise, all technical and scientific terms used have the same meaning as commonly understood by one of ordinary skill in the art to which this disclosure belongs. Although any methods and materials similar or equivalent to those described can also be used in the practice or testing of the present disclosure, the preferred methods and materials are now described.

All publications and patents cited in this specification are incorporated by reference as if each individual publication or patent were specifically and individually indicated to be incorporated by reference and are incorporated by reference to disclose and describe the methods and/or materials in connection with which the publications are cited. The citation of any publication is for its disclosure prior to the filing date and should not be construed as an admission that the present disclosure is not entitled to antedate such publication by prior disclosure. Further, the dates of publication provided could differ from the actual publication dates that may need to be independently confirmed.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

At least the following is claimed:

1. A method of forming a paper-based substrate memory device, comprising:
    coating one or more areas of a paper substrate with a conductor material to form a first electrode of the memory device;
    depositing, with the least one printer, a layer of material to serve as a switching medium over one or more areas of the conductor material;
    depositing, with at least one printer, at least one diode onto the switching medium layer; and
    depositing, with the least one printer, a layer of a metal onto the at least one diode to form a second electrode of the memory device,
    wherein the at least one diode is deposited onto one or more selected areas of the switching medium layer, the diode deposited by depositing a first material ink having a first fermi level onto the switching medium layer and next depositing a second material ink having a second fermi level onto the first material ink, the second fermi level being different than the first fermi level.

2. The method of claim 1, wherein coating the one or more areas of the paper substrate comprises coating and curing a plurality of individual layers of the conductor material over the one or more areas of the paper substrate.

3. The method of claim 1, further comprising using a screen printer for coating the conductor material upon the one or more areas of a paper substrate.

4. The method of claim 1, wherein depositing the switching medium layer comprises depositing a plurality of layers of the switching medium layer over the one or more areas of the conductor material.

5. The method of claim 1, further comprising using an ink jet printer for depositing the switching medium layer over the one or more areas of the conductor material, depositing the layer of the metal over the one or more areas of the insulator material, or both.

6. The method of claim 1, wherein the conductor material is selected from the group consisting of carbon, copper, aluminum, nickel, gold, silver, titanium, germanium, platinum and palladium.

7. The method of claim 1, wherein the conductor material is a carbon paste.

8. The method of claim 1, wherein the switching medium layer is a semiconductor material.

9. The method of claim 1, wherein the switching medium layer is selected from the group consisting of titanium dioxide, zinc oxide, copper oxide, nickel oxide, molybdenum disulfide, and gallium nitride.

10. The method of claim 1, wherein the switching medium layer comprises a titanium dioxide ink comprising $TiO_2$ nanoparticles, acetyl acetone, Triton-X-100, distilled water, ethanol, and ethylene glycol.

11. The method of claim 1, wherein the metal is a metal having mobile metal ions.

12. The method of claim 1, wherein the metal is selected from the group consisting of silver, copper, nickel, zinc and gold.

13. The method of claim 1, wherein the metal comprises a silver ink comprising Ag nanoparticles, ethylene glycol, and water.

14. The method of claim 1, wherein the first fermi level of the first material ink and the second fermi level of the second material ink are selected to form a Schottky diode.

15. The method of claim 1, wherein the at least one printer is a screen printer, an inkjet printer, a micro-contact printer, or a 3D printer.

16. A method of forming a paper-based substrate memory device, comprising:
coating one or more areas of a paper substrate with a conductor material to form a first electrode of the memory device;
depositing, with the least one printer, a layer of material to serve as a switching medium over one or more areas of the conductor material;
depositing, with at least one printer, at least one diode onto the switching medium layer; and
depositing, with the least one printer, a layer of a metal over the at least one diode to form a second electrode of the memory device;
wherein the conductor material is deposited as a plurality of strips onto the paper substrate, the metal layer is deposited as a plurality of strips over the conductor material at a non-zero angle in relation to the strips of the conductor material to form a plurality of juxtaposed intersections between the strips of the conductor material and the metal layer, the switching medium layer is deposited onto the conductor material between the conductor material and the metal layer within the intersections and a diode is deposited onto the switching medium layer between the switching medium layer and the metal layer strips at each intersection.

17. The method of claim 16, wherein the thickness of the switching medium at one juxtaposed intersection is thicker than the thickness of the switching medium at a second juxtaposed intersection such that the one juxtaposed intersection and the second juxtaposed intersection have a different HRS resistance state.

18. A paper-based substrate memory device, comprising:
a paper substrate coated with a conductor material;
a layer of material to serve as a switching medium deposited over one or more areas of the conductor material, the switching medium layer having a thickness of more than 40 µm to less than 100 µm;
at least one diode deposited over an area of the switching medium layer; and
a layer of metal deposited onto the at least one diode,
wherein the at least one diode is comprised of two different material inks, the material inks having a difference in a fermi level of the material inks.

19. The device of claim 18, wherein:
the conductor material forms a first electrode of the memory device; and
the metal forms a second electrode of the memory device.

20. The device of claim 18, wherein the conductor material is selected from the group consisting of carbon, copper, aluminum, nickel, gold, silver, titanium, germanium, platinum and palladium.

21. The device of claim 18, wherein the conductor material is a carbon paste.

22. The device of claim 18, wherein the switching medium layer is a semiconductor material.

23. The device of claim 18, wherein the switching medium layer is selected from the group consisting of titanium dioxide, zinc oxide, copper oxide, nickel oxide, molybdenum disulfide, and gallium nitride.

24. The device of claim 18, wherein the metal is a metal having mobile metal ions.

25. The device of claim 18, wherein the metal is selected from the group consisting of silver, copper, nickel, zinc and gold.

26. The device of claim 18, wherein:
the conductor material is carbon paste and the paper substrate is coated with the carbon paste using a screen printer;
the switching medium layer is titanium dioxide and the layer of titanium dioxide is deposited using at least one ink jet printer; and
the metal layer is silver and the layer of silver is deposited using the at least one ink jet printer.

27. The device of claim 18, wherein the material inks have a difference in a fermi level of the material inks to provide a Schottky diode.

28. The device of claim 18, wherein the device is a WORM memory device.

29. A method of forming a paper-based substrate memory device, comprising:

coating one or more areas of a paper substrate with a conductor material to form a first electrode of the memory device;

depositing, with the least one printer, a layer of material to serve as a switching medium over one or more areas of the conductor material;

depositing, with at least one printer, at least one diode onto the switching medium layer; and depositing, with the least one printer, a layer of a metal over the at least one diode to form a second electrode of the memory device;

wherein the conductor material is deposited as a plurality of strips onto the paper substrate, the metal layer is deposited as a plurality of strips over the conductor material at a non-zero angle in relation to the strips of the conductor material to form a plurality of juxtaposed intersections between the strips of the conductor material and the metal layer, the switching medium layer is deposited onto the conductor material between the conductor material and the metal layer within at least one intersection and a diode is deposited onto the switching medium layer between the switching medium layer and the metal layer strips at the at least one intersection.

* * * * *